United States Patent
Yeoh et al.

(10) Patent No.: US 10,368,167 B2
(45) Date of Patent: Jul. 30, 2019

(54) AUDIO POWER CIRCUIT AND METHOD

(71) Applicant: MOTOROLA SOLUTIONS, INC., Chicago, IL (US)

(72) Inventors: Chen Kok Yeoh, Bukit Mertajam (MY); Joo Yih See, Penang (MY); Chin Seng Tan, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/362,070

(22) Filed: Nov. 28, 2016

(65) Prior Publication Data

US 2018/0152785 A1    May 31, 2018

(51) Int. Cl.
*H02J 7/00*      (2006.01)
*H03F 1/02*      (2006.01)
(Continued)

(52) U.S. Cl.
CPC ............ *H04R 3/007* (2013.01); *H02J 7/0029* (2013.01); *H03F 1/0216* (2013.01); *H03F 1/52* (2013.01);
(Continued)

(58) Field of Classification Search
CPC .............. H04R 2430/01; H04R 29/001; H04R 2203/00; H04R 3/007; H03F 1/0216;
(Continued)

(56) References Cited

U.S. PATENT DOCUMENTS 3,529,210 A * 9/1970 Yuichi ...................... H01H 9/42
                                                    361/3
3,959,735 A * 5/1976 GrosJean ................... H03F 1/52
                                                    330/207 P
(Continued)

FOREIGN PATENT DOCUMENTS

GB          2534949        8/2016
WO        2013019118       2/2013

OTHER PUBLICATIONS

Texas Instrument, "ILM4951A (active)—Wide Voltage Range 1.8 Watt Audio Power Amplifier with Short Circuit Protection," technical document (1995-2016) 2 pages, http://www.ti.com/product/LM4951A.

(Continued)

*Primary Examiner* — Davetta W Goins
*Assistant Examiner* — Kuassi A Ganmavo
(74) *Attorney, Agent, or Firm* — Michael Best & Friedrich LLP

(57) ABSTRACT

An apparatus and method for controlling an audio power circuit. The audio power circuit includes an audio amplifier having a power input and a speaker connected to the audio amplifier. The audio power circuit also includes a control circuit configured to be connected to a battery and the power input and to control a supply of power to the power input. The audio power circuit further includes a thermal protection circuit connected between the audio amplifier and the speaker, the thermal protection circuit configured to generate a thermal protection signal and provide the same to the (Continued)

control circuit, wherein the control circuit is further configured to control the supply of power based on the thermal protection signal.

13 Claims, 4 Drawing Sheets

(51) Int. Cl.
*H03F 1/52* (2006.01)
*H04R 3/00* (2006.01)
*H03F 3/183* (2006.01)
*H04R 29/00* (2006.01)

(52) U.S. Cl.
CPC .......... *H03F 3/183* (2013.01); *H04R 29/001* (2013.01); *H02J 2007/0039* (2013.01); *H03F 2200/447* (2013.01); *H03F 2200/78* (2013.01); *H04R 2499/11* (2013.01)

(58) Field of Classification Search
CPC ...... H03F 1/52; H03F 3/183; H03F 2200/447; H03F 2200/78
See application file for complete search history.

(56) References Cited

U.S. PATENT DOCUMENTS

| | | | |
|---|---|---|---|
| 4,146,847 A * | 3/1979 | Otao | H02H 5/04 330/143 |
| 4,296,278 A | 10/1981 | Cullison et al. | |
| 4,301,330 A | 11/1981 | Trump | |
| 4,427,951 A * | 1/1984 | Amada | H03F 1/0222 330/297 |
| 5,224,169 A * | 6/1993 | Morris, Jr. | H03F 1/52 330/207 P |
| 5,469,002 A | 11/1995 | Garrett | |
| 5,631,566 A | 5/1997 | Person et al. | |
| 5,847,610 A * | 12/1998 | Fujita | H03F 1/52 330/298 |
| 5,973,569 A | 10/1999 | Nguyen | |
| 6,339,526 B1 * | 1/2002 | Aboyoussef | H02H 3/24 327/527 |
| 6,545,515 B2 | 4/2003 | Takahashi et al. | |
| 7,068,012 B1 | 6/2006 | Geren et al. | |
| 8,575,898 B2 | 11/2013 | Kitano et al. | |
| 9,444,248 B2 | 9/2016 | Erhart | |
| 2004/0169494 A1 * | 9/2004 | Kim | H02J 7/0031 320/128 |
| 2005/0242885 A1 * | 11/2005 | Craynon | H03F 1/0233 330/297 |
| 2006/0052129 A1 * | 3/2006 | Hong | H04M 1/72522 455/550.1 |
| 2007/0080745 A1 * | 4/2007 | French | H03F 1/34 330/10 |
| 2008/0101638 A1 * | 5/2008 | Ziller | H04M 1/6025 381/334 |
| 2009/0143111 A1 * | 6/2009 | Oglesbee | H04B 1/04 455/572 |
| 2010/0022209 A1 * | 1/2010 | Ng | H04B 1/0466 455/127.2 |
| 2011/0182434 A1 * | 7/2011 | Martz | H04R 3/007 381/55 |
| 2012/0033820 A1 * | 2/2012 | Wang | H04R 3/007 381/55 |
| 2012/0225331 A1 | 9/2012 | Tartaglia | |
| 2013/0077796 A1 | 3/2013 | Risbo et al. | |
| 2013/0181683 A1 | 7/2013 | Wang et al. | |
| 2014/0086418 A1 * | 3/2014 | Lubberhuizen | H04R 9/022 381/55 |
| 2015/0086026 A1 | 3/2015 | Tan et al. | |
| 2015/0263684 A1 * | 9/2015 | Tu | H04R 3/00 381/120 |
| 2015/0349509 A1 * | 12/2015 | Hingorani | H02H 1/06 361/56 |
| 2017/0331304 A1 | 11/2017 | Arendell et al. | |

OTHER PUBLICATIONS

Sibson, "Over-current protection in audio amplifiers," technical document (Aug. 6, 2008) 3 pages, http://www.eetimesti.com/document.asp?doc_id=1274919.

Office Action from the US Patent and Trademark Office for U.S. Appl. No. 15/155,766 dated Feb. 23, 2018 (10 pages).

PCT/US2017/059020 International Search Report and Written Opinion of the International Searching Authority dated Jan. 5, 2018 (16 pages).

Office Action from the US Patent and Trademark Office for Application No. 15/155,766 dated Jul. 27, 2018 (11 pages).

Office Action from the US Patent and Trademark Office for U.S. Appl. No. 15/492,863 dated Apr. 9, 2019 (10 pages).

\* cited by examiner

AUDIO POWER CIRCUIT AND METHOD

BACKGROUND OF THE INVENTION

Portable communications devices, for example, two-way radios, smart telephones, and the like may become heated. Heating of a portable communications device may occur due to exposure to external heat sources, for example, sun light, a radiator, etc. Heating may also occur as a result of heat generated by internal components.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
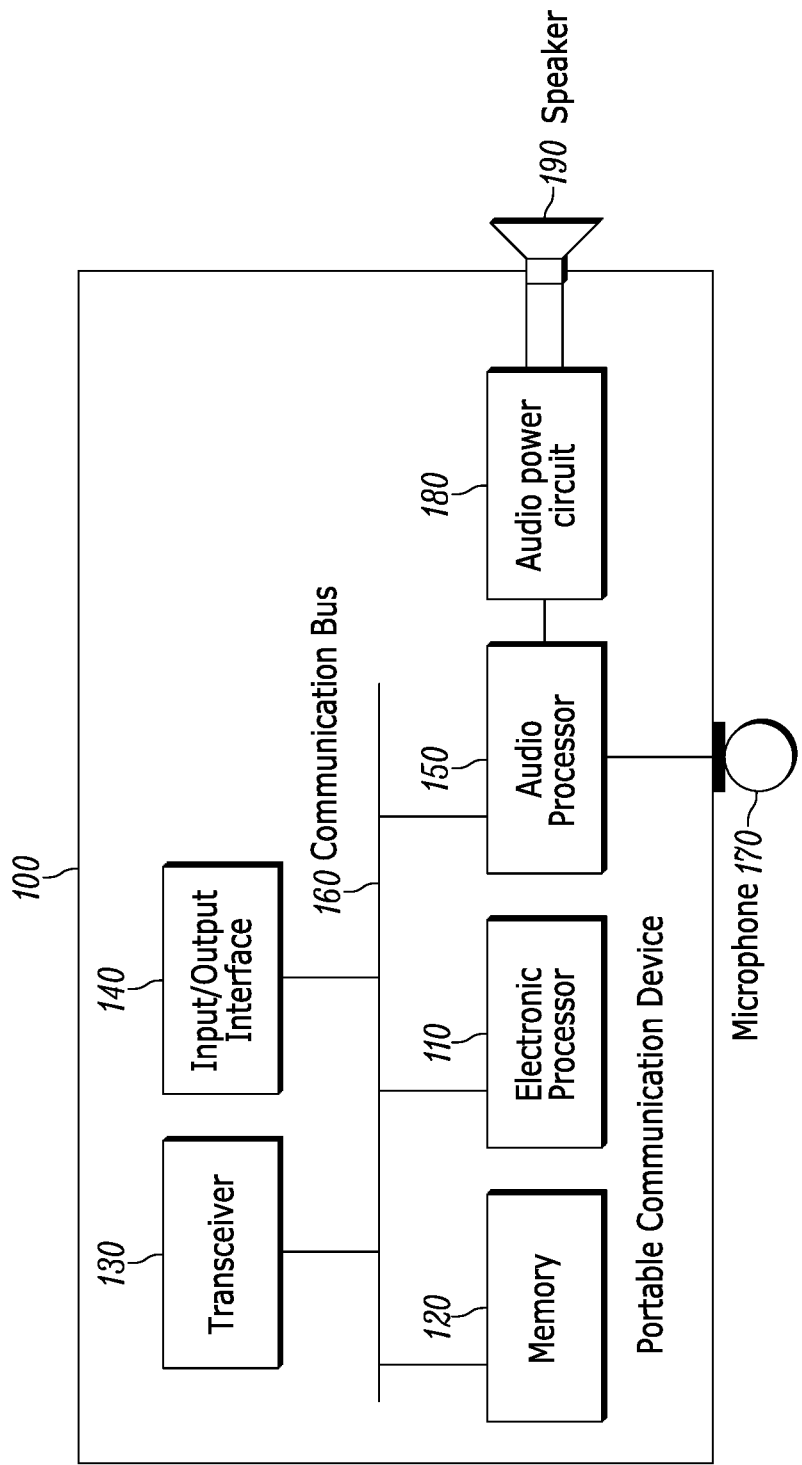
FIG. 1 is a diagram of a portable communications device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

While reducing or mitigating heating due to external sources may be addressed by simply moving a communication device away from an external source of heat, addressing heating due to internal sources often requires a more sophisticated approach. In many instances, regulating the amount of heat generated by internal components is important to maintain proper operation of the portable communications devices and to maintain the surface of the portable communications device below a temperature that causes physical discomfort to a user.

The speakers used by portable communications devices may temporarily malfunction due to short circuit, where one terminal of the speaker is grounded. In a short-circuit condition, current flow through the speaker may generate heat, which may affect other internal components and radiate to an external surface of the portable communications device. Among, other things, embodiments of the invention help control heating of a portable communications device.

One embodiment provides an audio power circuit including an audio amplifier having a power input and a speaker connected to the audio amplifier. The audio power circuit also includes a control circuit configured to be connected to a battery and the power input and to control a supply of power to the power input. The audio power circuit further includes a thermal protection circuit connected between the audio amplifier and the speaker. The thermal protection circuit is configured to generate a thermal protection signal and provide the same to the control circuit. The control circuit is further configured to control the supply of power based on the thermal protection signal.

Another embodiment provides a method for controlling an audio power circuit including providing, with a battery, a supply of power to an audio amplifier connected to a speaker. The method also includes outputting, with a thermal protection circuit connected between the audio amplifier and the speaker, a thermal protection signal. The method further includes controlling, with a control circuit connected between the battery and the audio amplifier. The supply of power to the audio amplifier is based on the thermal protection signal.

Another embodiment provides a portable communications device including a transceiver, an electronic processor coupled to the transceiver, and an audio processor coupled to the electronic processor. The audio processor is configured to receive audio signals from an internal microphone and provide audio output to an internal speaker. The portable communications device also includes an audio amplifier connected between the audio processor and the internal speaker. The audio amplifier has a power input. The portable communications device further includes a control circuit configured to be connected to a battery and the power input and to control a supply of power to the power input. The portable communications device further includes a thermal protection circuit connected between the audio amplifier and the internal speaker. The thermal protection circuit is configured to generate a thermal protection signal and provide the same to the control circuit. The control circuit is further configured to control the supply of power based on the thermal protection signal.

FIG. 1 is a diagram of one embodiment of a portable communications device 100. The portable communications device 100 may be, for example, a two-way radio, a mobile device, a table computer, a personal computer, and the like. In the example illustrated, the portable communications device 100 includes an electronic processor 110, a memory 120, a transceiver 130, an input/output interface 140, and an audio processor 150. The electronic processor 110, the memory 120, the transceiver 130, the input/output interface 140, and the audio processor 150 communicate over one or more control and/or data buses (for example, a communication bus 160). FIG. 1 illustrates only one exemplary embodiment of a portable communications device 100. The portable communications device 100 may include more or fewer components and may perform functions other than those explicitly described herein.

In some embodiments, the electronic processor 110 is implemented as a microprocessor with separate memory, such as the memory 120. In other embodiments, the electronic processor 110 may be implemented as a microcontroller (with memory 120 on the same chip). In other embodiments, the electronic processor 110 may be implemented using multiple processors. In addition, the electronic processor 110 may be implemented partially or entirely as, for example, a field-programmable gate array (FPGA), and application specific integrated circuit (ASIC), and the like and the memory 120 may not be needed or be modified accordingly. In the example illustrated, the memory 120 includes non-transitory, computer-readable memory that stores instructions that are received and executed by the electronic processor 110 to carry out functionality of the portable communications device 100 described herein. The memory 120 may include, for example, a program storage area and a data storage area. The program storage area and the data storage area may include combinations of different types of memory, such as read-only memory and random-access memory.

The transceiver 130 enables wireless communication from the portable communications device 100 to, for example, other portable communications devices 100, a call controller, or other electronic devices. In other embodiments, rather than the transceiver 130, the portable communications device 100 may include separate transmitting and receiving components, for example, a transmitter, and a receiver. In yet other embodiments, the portable communications device 100 may not include a transceiver 130 and may communicate with other electronic devices via a network interface and a wired connection to a communication network.

As noted above, the portable communications device 100 may include the input/output interface 140. The input/output interface 140 may include one or more input mechanisms (for example, a touch screen, a keypad, a button, a knob, and the like), one or more output mechanisms (for example, a display, a printer, and the like), or a combination thereof. The input/output interface 140 receives input from input devices actuated by a user, and provides output to output devices with which a user interacts.

The audio processor 150 is electrically connected to a microphone 170. The audio processor 150 is also electrically connected to a speaker 190 through an audio power circuit 180. The audio processor 150 receives audio input from the microphone 170 and converts the analog audio signals to digital signals that may be processed by the electronic processor 110 and transmitted via the transceiver 130. The audio processor 150 may also convert digital signals that are received from, for example, the transceiver 130 or the electronic processor 110 to analog signals that may be output using the speaker 190. In some embodiments, the audio processor 150, the microphone 170, the audio power circuit 180, and the speaker 190 form part of the input/output interface 140.

Figure 2:
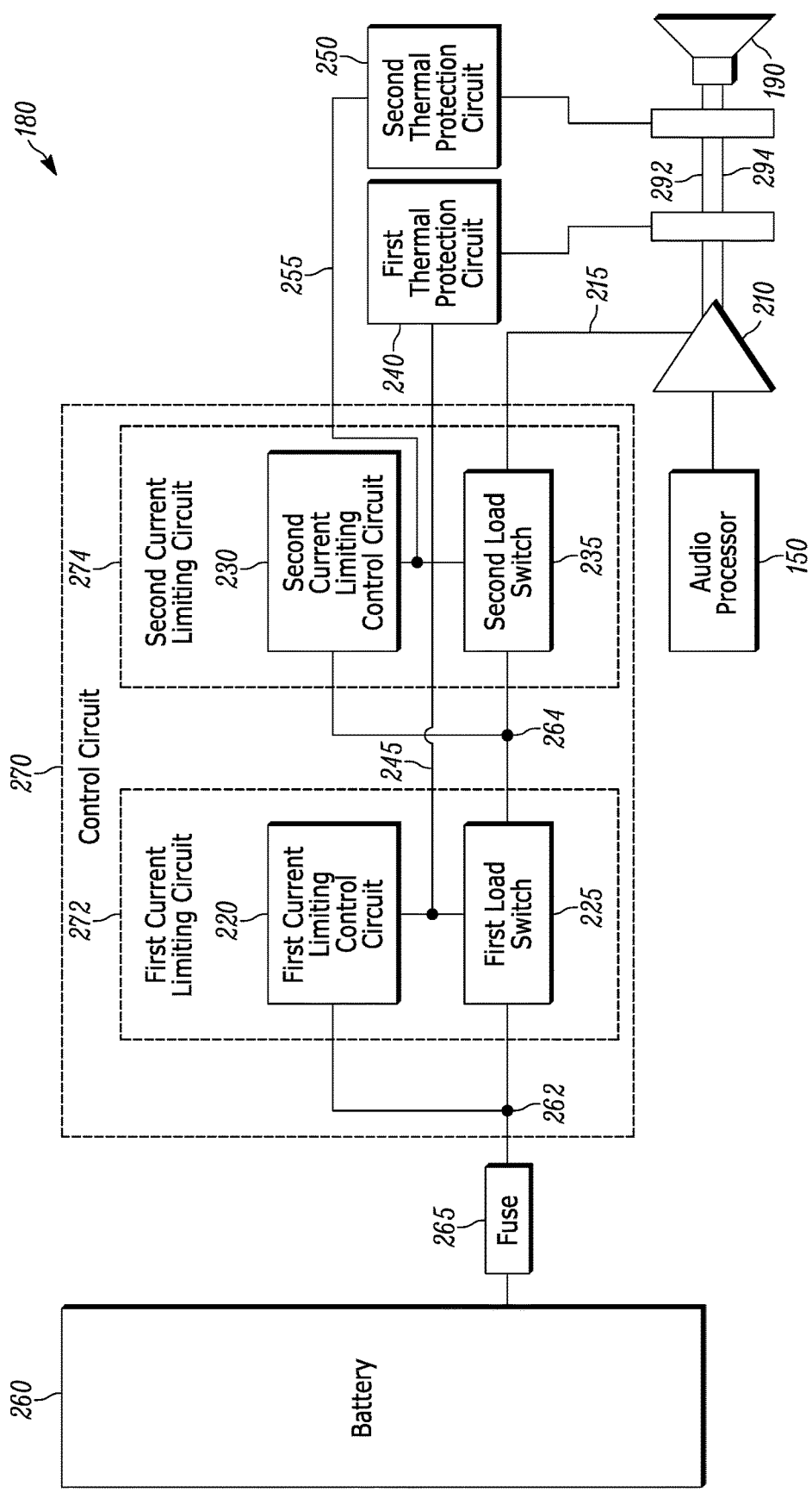
FIG. 2 is a block diagram of an audio power circuit of the portable communications device of FIG. 1 in accordance with some embodiments.

FIG. 2 is a block diagram of one embodiment of the audio power circuit 180. The audio power circuit 180 prevents excess current flowing to the speaker 190. The audio power circuit 180 also prevents the speaker 190 and the portable communications device 100 from generating excess heat. In the example illustrated, the audio power circuit 180 includes an audio amplifier 210, first current limiting control circuit 220, a second current limiting control circuit 230, a first thermal protection circuit 240, and a second thermal protection circuit 250. FIG. 2 illustrates only one exemplary embodiment of an audio power circuit 180. The audio power circuit 180 may include more or fewer components than illustrated and may perform additional functions other than those described herein.

The audio amplifier 210 includes a power input 215. The power input 215 is connected to a battery 260 of the portable communications device 100 through a first load switch 225 and a second load switch 235. The audio amplifier 210 receives audio signals from the audio processor 150. The audio amplifier 210 amplifies the audio signals from the audio processor 150 and provides the amplified audio signals to the speaker 190.

The first current limiting control circuit 220 is connected to the battery 260 and controls a supply of power to the power input 215 through the first load switch 225. The first current limiting control circuit 220 monitors a current flow between the battery 260 and the power input 215. More specifically, the first current limiting control circuit 220 monitors a current at node 262. The first current limiting control circuit 220 provides a control signal to the first load switch 225. When the first current limiting control circuit 220 determines that the current flowing between the battery 260 and the power input 215 exceeds a threshold, the first current limiting control circuit 220 opens the first load switch 225 to limit the current flow.

The second current limiting control circuit 230 is connected in series with the first current limiting control circuit 220 to the battery 260 and controls a supply of power to the power input 215 through the second load switch 235. The second current limiting control circuit 230 monitors a current flow between the battery 260 and the speaker 190. More specifically, the second current limiting control circuit 230 monitors a current at node 264. In some embodiments, rather than monitoring current at node 264, the second current limiting control circuit 230 may monitor a current at node 262. The second current limiting control circuit 230 provides a control signal to the second load switch 235. The second current limiting control circuit 230 operates similar to the first current limiting control circuit 220 to control the second load switch 235.

The first thermal protection circuit 240 is connected between the audio amplifier 210 and the speaker 190. The first thermal protection circuit 240 monitors a voltage between a positive terminal 292 and a negative terminal 294 of the speaker 190 (for example, a speaker voltage). As described in more detail below, the first thermal protection circuit 240 includes a reference voltage input to receive a reference voltage. The first thermal protection circuit 240 generates a first thermal protection signal and provides the same through a first thermal protection input 245 to the first load switch 225. When the first thermal protection circuit 240 determines that the voltage between the positive terminal 292 and the negative terminal 294 of the speaker 190 exceeds a reference voltage, the first thermal protection circuit 240 opens the first load switch 225.

The second thermal protection circuit 250 is connected in parallel to the first thermal protection circuit 240 and between the audio amplifier 210 and the speaker 190. The second thermal protection circuit 250 monitors a voltage between the positive terminal 292 and the negative terminal 294 of the speaker 190. As described in more detail below, the second thermal protection circuit 250 includes a second reference voltage input to receive a reference voltage. The second thermal protection circuit 250 generates a second thermal protection signal and provides the same through a second thermal protection input 255 to the second load switch 235. The second thermal protection circuit 250 operates similar to the first thermal protection circuit 240 to control the second load switch 235.

In some embodiments, the first current limiting control circuit 220, the first load switch 225, the second current limiting control circuit 230, and the second load switch 235 together form a control circuit 270. The control circuit 270 controls a supply of power to the power input 215. In other embodiments, the control circuit 270 may include different component circuits instead of the first current limiting control circuit 220, the first load switch 225, the second current limiting control circuit 230, and the second load switch 235 to control the supply of power to the power input 215. In some embodiments, rather than cutting off the supply of power to the audio amplifier 210, the control circuit 270 may limit the amount of current to the audio amplifier 210. For example, the control circuit 270 may limit the current to four hundred thirty (430) milliamperes during a fault condition. Controlling the supply of power may include controlling the voltage provided to the audio amplifier 210 and/or the current provided to the audio amplifier 210. In one embodiment, controlling the supply of power includes controlling a current provided to the audio amplifier 210. In some embodiments, a fuse 265 is connected between the battery 260 and the audio power circuit 180 to protect the components of the audio power circuit 180. The fuse 265 prevents the need for high-power components in the control circuit 270 to meet HAZLOC standards.

In some embodiments, the first current limiting control circuit 220 and the first load switch 225 may together form a first current limiting circuit 272 and the second current limiting control circuit 230 and the second load switch 235 may together form the second current limiting circuit 274. In these embodiments, the first thermal protection signal is provided to the first current limiting circuit 272 and the second thermal protection signal is provided to the second current limiting circuit 274.

In some embodiments, the audio power circuit 180 may include only one thermal protection circuit, for example, only the first thermal protection circuit 240. In these embodiments, the first thermal protection circuit 240 provides the first thermal protection signal to the control circuit 270 and the control circuit 270 controls the supply of power based on the first thermal protection signal. A person skilled in the art would appreciate that the second current limiting control circuit 230, the second load switch 235, and the second thermal protection circuit 250 are redundant and provided in case of failure to the first current limiting control circuit 220, the first load switch 225, or the first thermal protection circuit 240. Other combinations of the current limiting control circuits, the load switches, and the thermal protection circuits may be used to achieve the functionality described herein. For example, the control circuit 270 may include only the first current limiting circuit 272 and the first thermal protection signal and the second thermal protection signal may both be provided to the first current limiting circuit 272 to control the first load switch 225.

Figure 3:
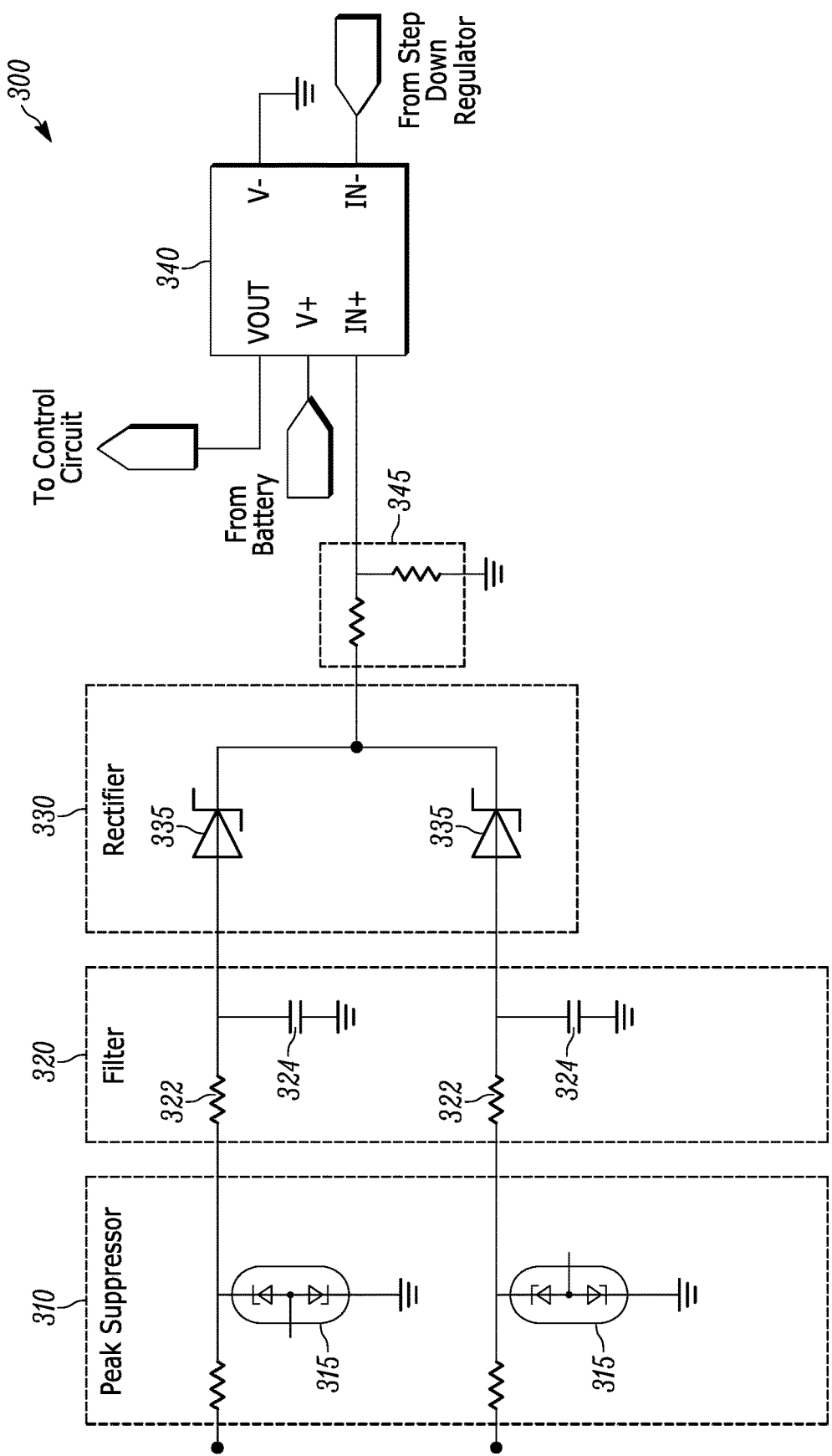
FIG. 3 is a schematic diagram of a thermal protection circuit of the audio power circuit of FIG. 2 in accordance with some embodiments.

FIG. 3 is a schematic diagram of one embodiment of a thermal protection circuit 300. The first thermal protection circuit 240 and the second thermal protection circuit 250 may be implemented similar to the thermal protection circuit 300. In the example illustrated, the thermal protection circuit 300 includes a peak suppressor 310 (for example, a first peak suppressor and a second peak suppressor), a filter 320 (for example, a first filter and a second filter), a rectifier 330 (for example a first rectifier and a second rectifier), and a comparator 340 (for example, a first comparator and a second comparator). The peak suppressor 310 is connected to the positive terminal 292 and the negative terminal 294 of the speaker 190. The peak suppressor 310 receives the amplified alternating current (AC) signals from the audio amplifier 210. The peak suppressor 310 includes voltage regulator double diodes 315 which act as limiter diodes to prevent audio AC peaks from triggering the thermal protection circuit 300. The output of the peak suppressor 310 is connected to the filter 320.

In the example illustrated, the filter 320 includes a combination of resistors 322 and capacitors 324 to form a low-pass filter and prevent audio frequency signals from triggering the thermal protection circuit 300. The output of the filter 320 is connected to the rectifier 330. In the example illustrated, the rectifier 330 includes diodes 335, for example, Schottky diodes, to convert AC voltage to direct current (DC) voltage. The rectifier 330 converts the AC voltage across the speaker 190 to DC voltage for use by the comparator 340. The output of the rectifier 330 is connected to the comparator 340 through, for example, a voltage divider 345.

In the example illustrated, the positive supply V+ of the comparator 340 is connected to the battery 260. In some embodiments, the positive supply V+ may also be connected to a voltage regulator (not shown) in order to provide improved functioning of the comparator 340. The negative supply V− is connected to ground. The inverting input IN− of the comparator 340 receives the reference voltage. The reference voltage may be provided to the comparator 340 by a step down regulator (not shown). The step down regulator may receive a power supply from the battery 260 and step-down the battery voltage to an optimum value set in accordance with surface temperature standards of the portable communications device 100 to operate in certain environments. In one example, the reference voltage may be three (3) Volts to meet certain technical or regulatory standards such as a maximum 90° Celsius surface temperature rating to operate in hazardous locations (sometimes referred to herein as "HAZLOC"). The non-inverting input IN+ receives the converted DC signals from the rectifier 330. The comparator 340 compares the voltages at the non-inverting input IN+ and inverting input IN−. The output VOUT of the comparator 340 is provided to a thermal protection input to control the first load switch 225. For example, the thermal protection input may be the first thermal protection input 245 and/or the second thermal protection input 255. The comparator 340 may be implemented, for example, with Analog Devices AD8565 operational amplifier.

Figure 4:
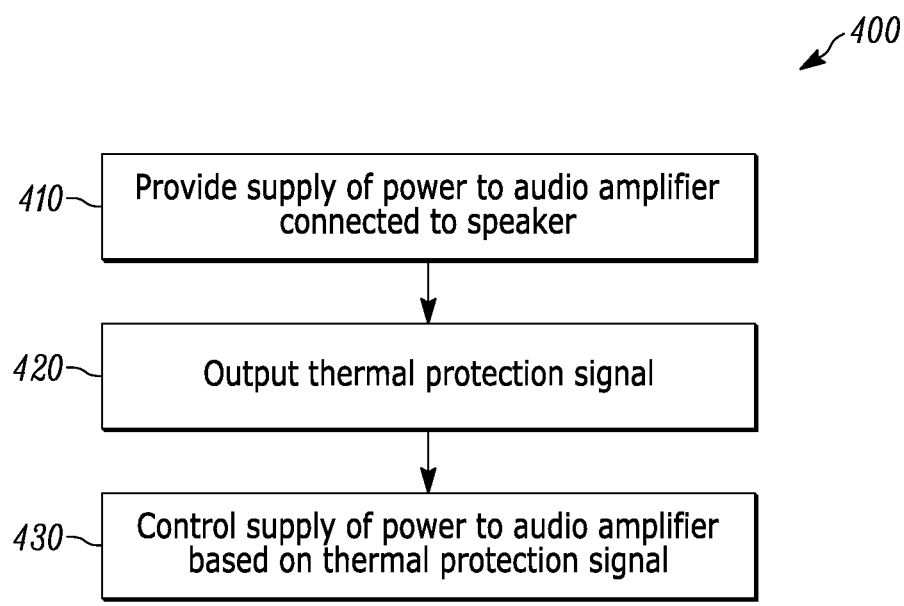
FIG. 4 is a flowchart of a method for controlling and audio power circuit in accordance with some embodiments.

FIG. 4 is a flowchart illustrating one example method 400 for controlling the audio power circuit 180. As illustrated in FIG. 4, the method 400 includes providing, with the battery 260, a supply of power to the audio amplifier 210 (at block 410). The supply of power is provided to the audio amplifier 210 through the first load switch 225 and the second load switch 235. As described above, the first load switch 225 is controlled by the first current limiting control circuit 220 and the first thermal protection circuit 240 and the second load switch 235 is controlled by the second current limiting control circuit 230 and the second thermal protection circuit 250.

The method 400 also includes outputting, with the thermal protection circuit 300 connected between the audio amplifier 210 and the speaker 190, thermal protection signal (at block 420). The thermal protection circuit 300 monitors the voltage between the positive terminal 292 and the negative terminal 294 of the speaker 190 at a non-inverting input IN+ (for example, a first speaker voltage input and a second speaker voltage input) of the comparator 340. The comparator 340 compares the voltage between the positive terminal 292 and the negative terminal 294 of the speaker 190 with the reference voltage. The comparator 340 generates the thermal protection signal at the output VOUT of the comparator 340 which is provided to the first load switch 225 and/or the second load switch 235.

The method 400 further includes controlling, with the control circuit 270 connected between the battery 260 and the audio amplifier 210, supply of power to the audio amplifier 210 based on the thermal protection signal (at block 430). The first thermal protection signal opens the first load switch 225 when the comparator 340 determines that the voltage between the positive terminal 292 and the negative terminal 294 exceeds the reference voltage. That is, the control circuit 270 disables the supply of power to the power input 215 of the audio amplifier 210 when the comparator 340 indicates that the speaker voltage exceeds the reference voltage. The first thermal protection signal closes the first load switch 225 when the comparator 340 determines that the voltage between the positive terminal 292 and the negative terminal 294 is below the reference voltage. That is, the control circuit 270 enables the supply of power to the power input 215 of the audio amplifier 210 when the comparator 340 indicates that the speaker voltage does not exceed the reference voltage. The second thermal protection signal operates similar to the first thermal protection signal to control the second load switch 235.

In some embodiments, the thermal protection circuit 300 keeps the first load switch 225 and/or the second load switch 235 open until a hard reset is performed on the portable communications device 100 when the comparator 340 determines that the voltage between the positive terminal 292 and the negative terminal 294 exceeds the reference voltage. The hard reset may be, for example, removing and re-inserting a battery pack of the portable communications device. In some embodiments, the control circuit 270 may permanently open the first load switch 225 and the second load switch 235 when the comparator 340 determines that the voltage between the positive terminal 292 and the negative terminal 294 exceeds the reference voltage.

The speaker 190 may include an inductive coil that acts as a resistor to generate heat in a fault condition. In order to avoid the speaker 190 from getting too hot, the voltage provided to the speaker 190 may need to be limited in order to prevent the speaker 190 from getting hot. One conventional technique for limiting voltage provided to the speaker 190 may include inserting a pair of Zener diodes between the audio amplifier 210 output and the speaker 190. In order to meet HAZLOC standards, high-power Zener diodes may be required which take up more space and clamp the audio voltage causing audio distortion and low level of audio output. Another conventional technique includes using polyswitches. At least two polyswitches may need to be added with one for each terminal of the speaker 190. However, polyswitches add additional resistance on the audio path under normal operating conditions and may have varying trip current limits based on the radio operating temperature. As a consequence, the audio performance of the speaker 190 may be reduced and the trip current threshold may be hard to control.

One advantage of the above techniques over the Zener diodes and the polyswitches is that a faulty speaker is detected and prevented from generating excess heat with limited negative impact on the audio performance of the speaker 190 under normal operating conditions. The thermal protection circuit 300 detects the faulted speaker and opens the first load switch 225 or the second load switch 235 to prevent current flow to the speaker 190 without increasing resistance at the speaker output. This helps prevents the surface temperature of the portable communications device 100 from going above 90° Celsius while maintaining the audio performance.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An audio power circuit comprising:
an audio amplifier having a power input;
a speaker connected to the audio amplifier;
a load switch coupled between a battery and the power input to selectively provide a supply of power from the battery to the power input;
a second load switch coupled between the battery and the power input in series with the load switch to selectively provide the supply of power from the battery to the power input;
a control circuit configured to be connected to the battery and the power input and to control the supply of power from the battery to the power input by controlling the load switch;
a thermal protection circuit connected between the audio amplifier and the speaker, the thermal protection circuit configured to generate a thermal protection signal and provide the same directly to the load switch to control the supply of power from the battery to the power input, wherein the thermal protection circuit includes:
a comparator having a reference voltage input to receive a reference voltage, and a speaker voltage input to receive a speaker voltage, wherein the thermal protection circuit disables the supply of power from the battery to the power input by opening the load switch when the comparator indicates that the speaker voltage exceeds the reference voltage;
a rectifier connected to the speaker voltage input and configured to convert an alternating current (AC) voltage across the internal speaker to a direct current (DC) voltage, wherein the AC voltage is provided by the audio amplifier; and
a second thermal protection circuit connected between the audio amplifier and the speaker and in parallel to the thermal protection circuit, the second thermal protection circuit configured to generate a second thermal protection signal and provide the same directly to the second load switch to control the supply of power from the battery to the power input.

2. The audio power circuit of claim 1, wherein the control circuit comprises:
a first current limiting circuit connected to the battery and the power input and configured to control the load switch; and
a second current limiting circuit connected to the battery and the power input and in series with the first current limiting circuit and configured to control the second load switch.

3. The audio power circuit of claim 1, wherein the second thermal protection circuit comprises:
a second comparator having a second reference voltage input to receive a reference voltage, and a second speaker voltage input to receive a speaker voltage.

4. The audio power circuit of claim 3, wherein the second thermal protection circuit disables the supply of power from the battery to the power input by opening the second load switch when the second comparator indicates that the speaker voltage exceeds the reference voltage.

5. The audio power circuit of claim 1, further comprising:
a fuse connected between the battery and the load switch.

6. The audio power circuit of claim 1, further comprising:
a peak suppressor connected across the speaker and configured to prevent AC peaks from triggering the thermal protection circuit.

7. A method for controlling an audio power circuit, the method comprising:
providing, with a battery, a supply of power to an audio amplifier connected to a speaker;
converting, with a rectifier of a thermal protection circuit, an alternating current (AC) voltage across the speaker to a direct current (DC) voltage, wherein the AC voltage is provided by the audio amplifier;
receiving, at a reference voltage input of a comparator of the thermal protection circuit, a reference voltage;
receiving, at a speaker voltage input of the comparator, the DC voltage;
comparing, with the comparator, the DC voltage to the reference voltage;
outputting, with the thermal protection circuit connected between the audio amplifier and the speaker, a thermal protection signal based on comparing the speaker voltage to the reference voltage, the thermal protection signal provided directly to a load switch coupled between the battery and the audio amplifier to selectively provide the supply of power from the battery to the audio amplifier;
controlling, with the thermal protection circuit, the load switch to control the supply of power from the battery to the audio amplifier;
outputting, with a second thermal protection circuit connected between the audio amplifier and the speaker, a second thermal protection signal, the second thermal protection signal provided directly to a second load switch coupled between the battery and the audio amplifier in series with the load switch to selectively provide the supply of power from the battery to the audio amplifier; and
controlling, with the second thermal protection circuit, the second load switch to control the supply of power from the battery to the audio amplifier.

8. The method of claim 7, wherein controlling the load switch to control the supply of power from the battery to the audio amplifier further comprising:
when the DC voltage exceeds the reference voltage, disabling the supply of power from the battery to the audio amplifier by opening the load switch; and when the DC voltage does not exceed the reference voltage, enabling the supply of power from the battery to the audio amplifier by closing the load switch.

9. The method of claim 7, further comprising:
preventing, using a peak suppressor connected across the speaker, AC peaks from triggering the thermal protection circuit.

10. A portable communications device comprising:
a transceiver;
an electronic processor coupled to the transceiver;
an audio processor coupled to the electronic processor and configured to receive audio signals from an internal microphone and provide audio output to an internal speaker;
an audio amplifier connected between the audio processor and the internal speaker and having a power input;
a load switch coupled between a battery and the power input to selectively provide a supply of power from the battery to the power input;
a second load switch coupled between the battery and the power input in series with the load switch to selectively provide the supply of power from the battery to the power input;
a control circuit configured to be connected to the battery and the power input and to control the supply of power from the battery to the power input by controlling the load switch; and
a thermal protection circuit connected between the audio amplifier and the internal speaker, the thermal protection circuit configured to generate a thermal protection signal and provide the same directly to the load switch to control the supply of power from the battery to the power input,
wherein the thermal protection circuit includes:
  a comparator having a reference voltage input to receive a reference voltage, and a speaker voltage input to receive a speaker voltage, wherein the thermal protection circuit disables the supply of power from the battery to the power input by opening the load switch when the comparator indicates that the speaker voltage exceeds the reference voltage;
  a rectifier connected to the speaker voltage input and configured to convert an alternating current (AC) voltage across the internal speaker to a direct current (DC) voltage, wherein the AC voltage is provided by the audio amplifier; and
a second thermal protection circuit connected between the audio amplifier and the internal speaker and in parallel to the thermal protection circuit, the second thermal protection circuit configured to generate a second thermal protection signal and provide the same directly to the second load switch to control the supply of power from the battery to the power input.

11. The portable communications device of claim 10, wherein the control circuit comprises:
a first current limiting circuit connected to the battery and the power input and configured to control the load switch; and
a second current limiting circuit connected to the battery and the power input and in series with the first current limiting circuit and configured to control the second load switch.

12. The portable communications device of claim 10, wherein the second thermal protection circuit comprises:
a second comparator having a second reference voltage input to receive a reference voltage, and a second speaker voltage input to receive a speaker voltage, wherein the second thermal protection circuit disables the supply of power from the battery to the power input by opening the second load switch when the second comparator indicates that the speaker voltage exceeds the reference voltage.

13. The portable communications device of claim 10, wherein the thermal protection circuit further comprises:
a peak suppressor connected across the speaker and configured to prevent AC peaks from triggering the thermal protection circuit.

* * * * *